US012559840B2

(12) United States Patent
Kashefi et al.

(10) Patent No.: US 12,559,840 B2
(45) Date of Patent: Feb. 24, 2026

(54) APPARATUS AND METHODS FOR SELF-ASSEMBLED MONOLAYER (SAM) DEPOSITION IN SEMICONDUCTOR EQUIPMENT

(71) Applicant: Applied Materials, Inc., Santa Clara, CA (US)

(72) Inventors: Kevin Kashefi, Sam Ramon, CA (US); Joel Minster Huston, Los Gatos, CA (US); Michael Lee McSwiney, Scappoose, OR (US); Carmen Leal Cervantes, Mountain View, CA (US); Yongjin Kim, Santa Clara, CA (US); Drew William Phillips, San Jose, CA (US); Mark Joseph Saly, Milpitas, CA (US)

(73) Assignee: Applied Materials Inc., Santa Clara, CA (US)

( * ) Notice: Subject to any disclaimer, the term of this patent is extended or adjusted under 35 U.S.C. 154(b) by 564 days.

(21) Appl. No.: 17/985,594

(22) Filed: Nov. 11, 2022

(65) Prior Publication Data

US 2023/0212747 A1    Jul. 6, 2023

Related U.S. Application Data

(60) Provisional application No. 63/295,774, filed on Dec. 31, 2021.

(51) Int. Cl.
C23C 16/455 (2006.01)
C23C 16/458 (2006.01)

(52) U.S. Cl.
CPC .. *C23C 16/45553* (2013.01); *C23C 16/45512* (2013.01); *C23C 16/45557* (2013.01);
(Continued)

(58) Field of Classification Search
CPC ........ C23C 16/45553; C23C 16/45512; C23C 16/45557; C23C 16/45565;
(Continued)

(56) References Cited

U.S. PATENT DOCUMENTS 9,214,340 B2 * 12/2015 Kurita ................. H10D 30/6713
10,273,577 B2 * 4/2019 Arnepalli .......... H01L 21/02271
(Continued)

FOREIGN PATENT DOCUMENTS

KR    20250033068 A  *  3/2025  .............. G05D 7/00
TW    202210658 A  *  3/2022  ....... H01L 21/76814
WO  WO-2018195420 A1 *  10/2018  ....... C23C 16/45551

OTHER PUBLICATIONS

International Search Report for PCT/US2022/0522008, dated Apr. 14, 2023,.

*Primary Examiner* — Jeffrie R Lund
(74) *Attorney, Agent, or Firm* — Moser Taboada

(57) ABSTRACT
Methods and apparatus for self-assembled monolayer (SAM) deposition are provided herein. In some embodiments, an apparatus for self-assembled monolayer (SAM) deposition includes: a chamber enclosing a processing volume; a substrate support disposed in the chamber and configured to support a substrate in the processing volume; a gas distribution system coupled to the chamber and configured to distribute a process gas into the processing volume; a first SAM precursor source fluidly coupled to the gas distribution system to provide a first SAM precursor as a part of the process gas; and a second SAM precursor source fluidly coupled to the gas distribution system to provide a second SAM precursor, different than the first SAM precursor, as a part of the process gas, wherein the first and second SAM precursor sources are independently controllable to control a relative percentage of the first and second SAM precursors in the process gas with respect to each other.

16 Claims, 2 Drawing Sheets

(52) U.S. Cl.
CPC .. *C23C 16/45565* (2013.01); *C23C 16/45574*
(2013.01); *C23C 16/458* (2013.01)

(58) Field of Classification Search
CPC ............ C23C 16/45574; C23C 16/458; C23C
16/45544; H01L 21/67207; H01L
21/67017; H01L 21/68785
See application file for complete search history.

(56) References Cited

U.S. PATENT DOCUMENTS

| | | | |
|---|---|---|---|
| 2002/0188378 A1 | 12/2002 | Derderian et al. | |
| 2007/0234956 A1* | 10/2007 | Dalton .............. | C23C 16/45574 |
| | | | 118/715 |
| 2014/0308822 A1 | 10/2014 | O'Hara | |
| 2015/0184287 A1* | 7/2015 | Tsung ..................... | C23C 16/04 |
| | | | 427/255.28 |
| 2017/0137937 A1 | 5/2017 | Arnepalli et al. | |
| 2017/0306491 A1* | 10/2017 | Liang ................ | C23C 16/45502 |
| 2017/0350004 A1* | 12/2017 | Kaufman-Osborn ........................ | |
| | | | H01L 21/6719 |
| 2019/0019674 A1 | 1/2019 | Färm | |
| 2019/0328114 A1 | 10/2019 | Kachian et al. | |
| 2020/0017969 A1* | 1/2020 | Chang .............. | C23C 16/45527 |
| 2023/0212747 A1* | 7/2023 | Kashefi ............. | C23C 16/45553 |
| | | | 118/728 |

\* cited by examiner

APPARATUS AND METHODS FOR SELF-ASSEMBLED MONOLAYER (SAM) DEPOSITION IN SEMICONDUCTOR EQUIPMENT

CROSS-REFERENCE TO RELATED APPLICATIONS

This application claims benefit of U.S. provisional patent application Ser. No. 63/295,774, which was filed Dec. 31, 2021, and which is herein incorporated by reference in its entirety.

FIELD

Embodiments of the present disclosure generally relate to apparatus and techniques for the deposition of self-assembled monolayers in semiconductor device fabrication equipment.

BACKGROUND

Traditionally, patterning in the microelectronics industry has been accomplished using various lithography and etch processes. However, since lithography is becoming exponentially complex and expensive, the use of selective deposition to build features is becoming much more attractive. One technique used in selective deposition uses a self-assembled monolayer (SAM) deposited from a precursor source that includes a fixed, pre-mixed proportion of compounds stored in an ampoule. However, the inventors have observed that the pre-mixed ampoule does not allow for any control after the ampoule is installed on the deposition tool. The inventors have further observed that, if the pre-mixed compound does not deliver the expected results on the wafer, or if the results drift over time, the only solution is to replace the ampoule.

Therefore, the inventors have provided improved apparatus and methods for depositing self-assembled monolayers on a substrate.

SUMMARY

Methods and apparatus for self-assembled monolayer (SAM) deposition are provided herein. In some embodiments, as apparatus for self-assembled monolayer (SAM) deposition includes: a chamber enclosing a processing volume; a substrate support disposed in the chamber and configured to support a substrate in the processing volume; a gas distribution system coupled to the chamber and configured to distribute a process gas into the processing volume; a first SAM precursor source fluidly coupled to the gas distribution system to provide a first SAM precursor as a part of the process gas; and a second SAM precursor source fluidly coupled to the gas distribution system to provide a second SAM precursor, different than the first SAM precursor, as a part of the process gas, wherein the first and second SAM precursor sources are independently controllable to control a relative percentage of the first and second SAM precursors in the process gas with respect to each other.

In some embodiments, an apparatus for self-assembled monolayer (SAM) deposition includes: a chamber enclosing a processing volume; a substrate support disposed in the chamber and configured to support a substrate in the processing volume; a gas distribution system coupled to the chamber and configured to distribute a process gas into the processing volume; a first SAM precursor source fluidly coupled to the gas distribution system to provide a first SAM precursor as a part of the process gas; and a second SAM precursor source fluidly coupled to the gas distribution system to provide a second SAM precursor, different than the first SAM precursor, as a part of the process gas, wherein the first and second SAM precursor sources are independently controllable to control a relative percentage of the first and second SAM precursors in the process gas with respect to each other; wherein the gas distribution system further comprises a showerhead having a plurality of fluidly independent gas passageways leading to the processing volume and including at least a first gas passageway and a second gas passageway, wherein the first SAM precursor source is coupled to the first gas passageway and the second SAM precursor source is coupled to the second gas passageway.

In some embodiments, an apparatus for self-assembled monolayer (SAM) deposition includes: a chamber enclosing a processing volume; a substrate support disposed in the chamber and configured to support a substrate in the processing volume; a gas distribution system coupled to the chamber and configured to distribute a process gas into the processing volume; a first SAM precursor source fluidly coupled to the gas distribution system to provide a first SAM precursor as a part of the process gas; and a second SAM precursor source fluidly coupled to the gas distribution system to provide a second SAM precursor, different than the first SAM precursor, as a part of the process gas, wherein the first and second SAM precursor sources are independently controllable to control a relative percentage of the first and second SAM precursors in the process gas with respect to each other; wherein the gas distribution system further comprises a showerhead having a plurality of fluidly independent gas passageways leading to the processing volume and including at least a first gas passageway and a second gas passageway, wherein the first SAM precursor source and the second SAM precursor source are both coupled to the first gas passageway. In some embodiments, a pulsing valve can be coupled in line between the second SAM precursor source and the showerhead.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
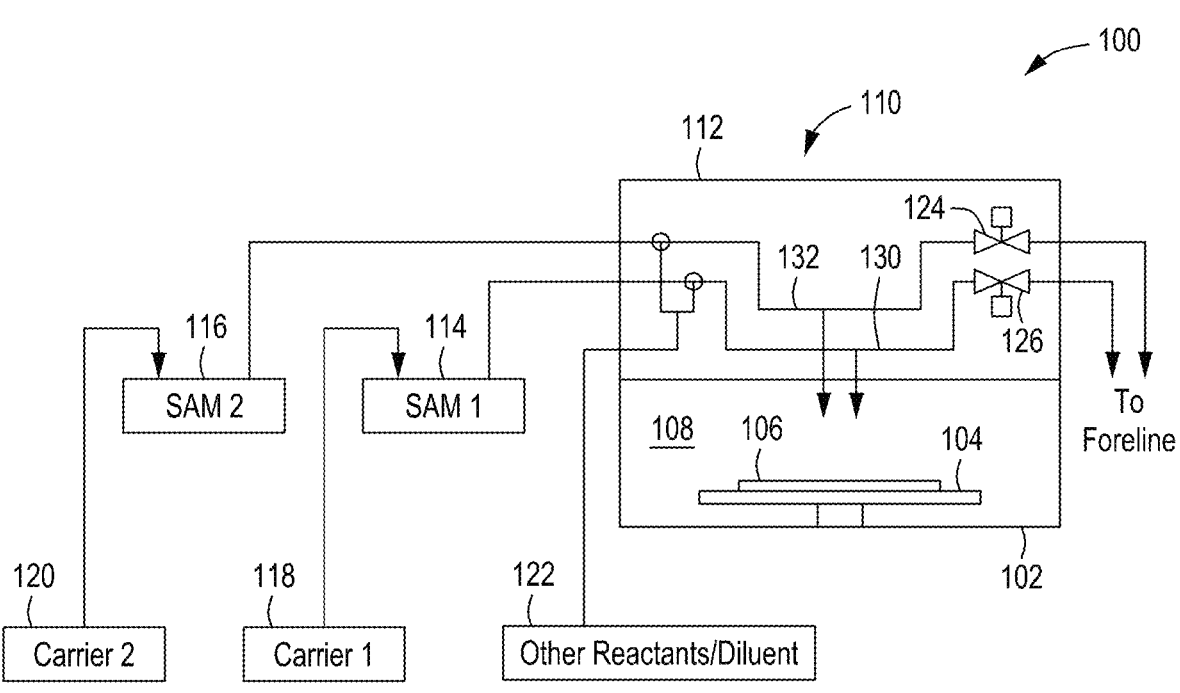
FIG. 1 is a system for depositing self-assembled monolayers in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for self-assembled monolayer (SAM) deposition are provided herein. Apparatus in accordance with the present disclosure include a gas distribution system having two sources of different self-assembled monolayer (SAM) precursors that can be independently controlled and provided to a processing volume of a process chamber. The system can provide for mixing in line prior to delivery to the processing volume or for independent introduction into the processing volume.

For example, the inventors have observed that using a pre-mixed proportion of SAM precursors in an ampoule does not allow for any control after the ampoule is coupled to the process chamber. Hence, if the pre-mixed ampoule does not deliver the expected results on the wafer, or the results drift over time, the only solution is to replace the ampoule. The apparatus of the present disclosure advantageously facilitates control over the ratio of SAM precursors, eliminating the need to stop processing and replace the ampoule in case of undesired variation from ampoule to ampoule. Moreover, apparatus and methods in accordance with the present disclosure advantageously facilitate change or control of the ratio of the different SAM precursors to achieve a desired or target deposition results on the substrate.

As a non-limiting example of an advantageous use of the apparatus and methods of the present disclosure, the inventors have observed that if a dopant is added to bulk SAM chemistry used in a process to selectively deposit tantalum nitride (TaN) on copper (Cu), the TaN thickness on Cu can be reduced (i.e., enhanced selectivity to exposed dielectric). Apparatus and methods in accordance with the present disclosure facilitates doping control through a control of the flow proportions or through proportional pulse durations of two SAM chemistries from two separate sources (e.g., ampoules, liquid delivery systems, etc.). Apparatus and methods in accordance with the present disclosure facilitate, for example, improvement of TaN deposition selectivity on Cu while not requiring that the SAM and the dopant be pre-mixed. Apparatus and methods in accordance with the present disclosure further facilitate for accurate injection of two chemistries to achieve a consistent and repeatable proportion, not only wafer to wafer, but also ampoule to ampoule. Apparatus and methods in accordance with the present disclosure further facilitate the qualification of dopants and adjustment of flow time/pulse time to get a selectivity result desired for a particular application.

FIG. 1 is a system 100 for depositing self-assembled monolayers in accordance with at least some embodiments of the present disclosure. As depicted in FIG. 1, the system 100 includes a chamber 102 enclosing a processing volume 108. A substrate support 104 is disposed in the chamber 102 and configured to support a substrate 106 in position in the processing volume 108. The substrate 106 can be, for example, any substrate used in microelectronic device fabrication such as but not limited to semiconductor wafers or the like.

A gas distribution system 110 is coupled to the chamber 102 and is configured to distribute a process gas into the processing volume 108. The gas distribution system 110 includes one or more gas passageways to flow a process gas into the processing volume 108. In some embodiments, the gas distribution system 110 includes a showerhead 112. In some embodiments, the gas distribution system 110 includes a plurality of fluidly independent gas passageways leading to the processing volume 108 and including at least a first gas passageway 130 and a second gas passageway 132. In some embodiments, the first gas passageway 130 and the second gas passageway 132 are part of the showerhead 112.

A first SAM precursor source 114 is fluidly coupled to the gas distribution system 110 to provide a first SAM precursor as a part of the process gas. The first SAM precursor source 114 can be an ampoule, a liquid delivery system, or other suitable device for storing and/or supplying the first SAM precursor to the gas distribution system 110. A first carrier gas source 118 can be coupled to the first SAM precursor source 114 to facilitate delivery of a desired amount of the first SAM precursor to the processing volume 108.

A second SAM precursor source 116 is fluidly coupled to the gas distribution system 110 to provide a second SAM precursor, different than the first SAM precursor, as a part of the process gas. The second SAM precursor source 116 can be an ampoule, a liquid delivery system, or other suitable device for storing and/or supplying the second SAM precursor to the gas distribution system 110. A second carrier gas source 120 can be coupled to the second SAM precursor source 116 to facilitate delivery of a desired amount of the second SAM precursor to the processing volume 108.

The first SAM precursor source 114 and the second SAM precursor source 116 are independently controllable to control a relative percentage of the first and second SAM precursors in the process gas with respect to each other. For example, in some embodiments the relative percentage of the first and second SAM precursors can be controlled by respective control of the first and second carrier gas flow rates and/or duration provided by the first carrier gas source 118 and the second carrier gas source 120.

In some embodiments, the first SAM precursor source 114 is coupled to the first gas passageway 130 and the second SAM precursor source 116 is coupled to the second gas passageway 132.

In some embodiments, an additional gas source 122 is coupled to at least one of the first gas passageway 130 or the second gas passageway 132. The additional gas source 122 can provide one or more of other reactant gases, diluents, or the like, as desired for a particular process or application. In some embodiments and as depicted in FIG. 1, the additional gas source 122 can be coupled to each of the first gas passageway 130 and the second gas passageway 132. In some embodiments, a mixer may be provided in the first gas passageway 130 and/or the second gas passageway 132 to facilitate mixing the one or more of other reactant gases, diluents, or the like provided by the additional gas source 122 with the first SAM precursor and/or the second SAM precursor.

In some embodiments, additional valves 124, 126 can be coupled to each of the first gas passageway 130 and the second gas passageway 132, for example, to couple either or both of the first gas passageway 130 and the second gas passageway 132 to a process foreline (e.g., to an exhaust of the system 100). For example, the additional valves 124, 126 can be configured to selectively, e.g., by operation of the valves 124, 126, divert flow to the process foreline rather than to the processing volume 108.

Figure 2:
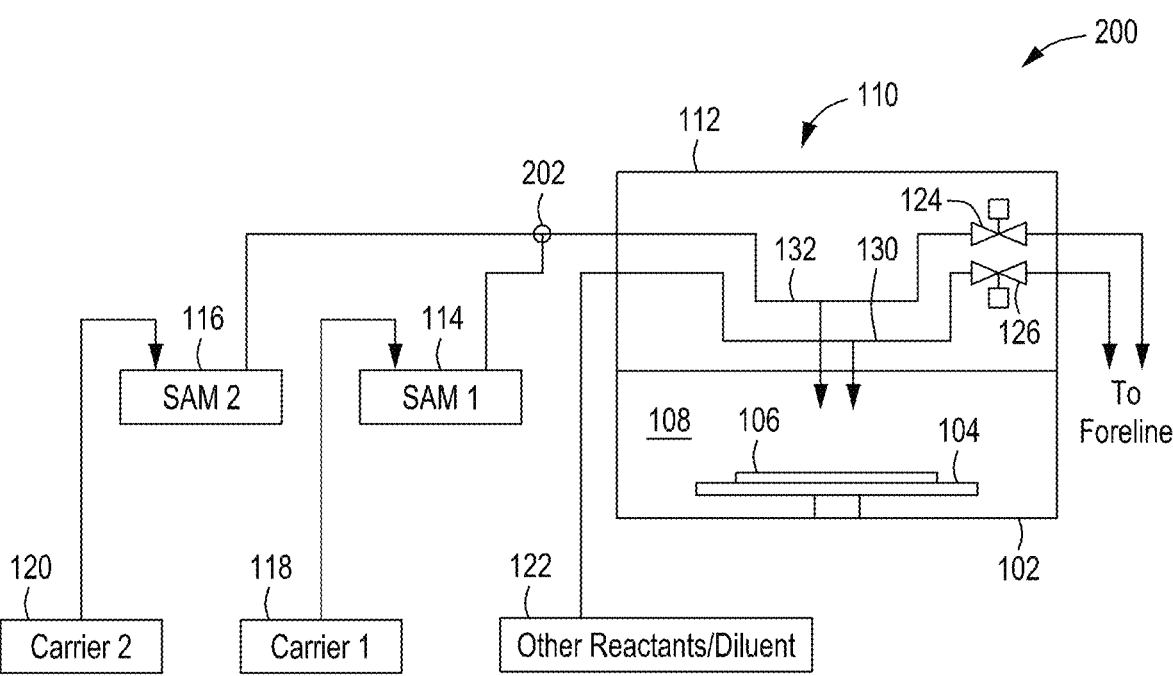
FIG. 2 is a system for depositing self-assembled monolayers in accordance with at least some embodiments of the present disclosure.

FIG. 2 is a system 200 for depositing self-assembled monolayers in accordance with at least some embodiments of the present disclosure. The system 200 is similar to the system 100 except as shown in FIG. 2 and as described herein. Elements in system 200 that are the same or substantially similar to those described above with respect to FIG. 1 have identical reference numerals and may not be further described if not necessary for the understanding of the present disclosure.

In some embodiments, and as depicted in FIG. 2, the first SAM precursor source 114 and the second SAM precursor source 116 are both coupled to a common gas passageway of the gas distribution system configured to mix the first SAM precursor and the second SAM precursor in the common gas passageway prior to delivery into the processing volume.

For example, in some embodiments, the first SAM precursor source 114 and the second SAM precursor source 116 are both coupled to the first gas passageway 130. Alternatively, or in combination, in some embodiments, the first SAM precursor source 114 and the second SAM precursor source 116 are both coupled to a mixer 202 configured to mix the first SAM precursor and the second SAM precursor in-line prior to delivery to the processing volume 108. The mixer 202 can be provided in place of or in addition to the showerhead 112.

In some embodiments, the first SAM precursor source 114 and the second SAM precursor source 116 are both coupled to the first gas passageway 130 and the additional gas source 122 is coupled to the second gas passageway 132.

As described above with respect to FIG. 1, the first SAM precursor source 114 and the second SAM precursor source 116 are independently controllable to control the relative percentage of the first and second SAM precursors in the process gas with respect to each other. For example, the relative percentage of the first and second SAM precursors can be controlled and provided to the mixer 202 then to the processing volume 108, to the mixer 202 then to the first gas passageway 130, or to the first gas passageway 130 without a separate mixer 202.

Figure 3:
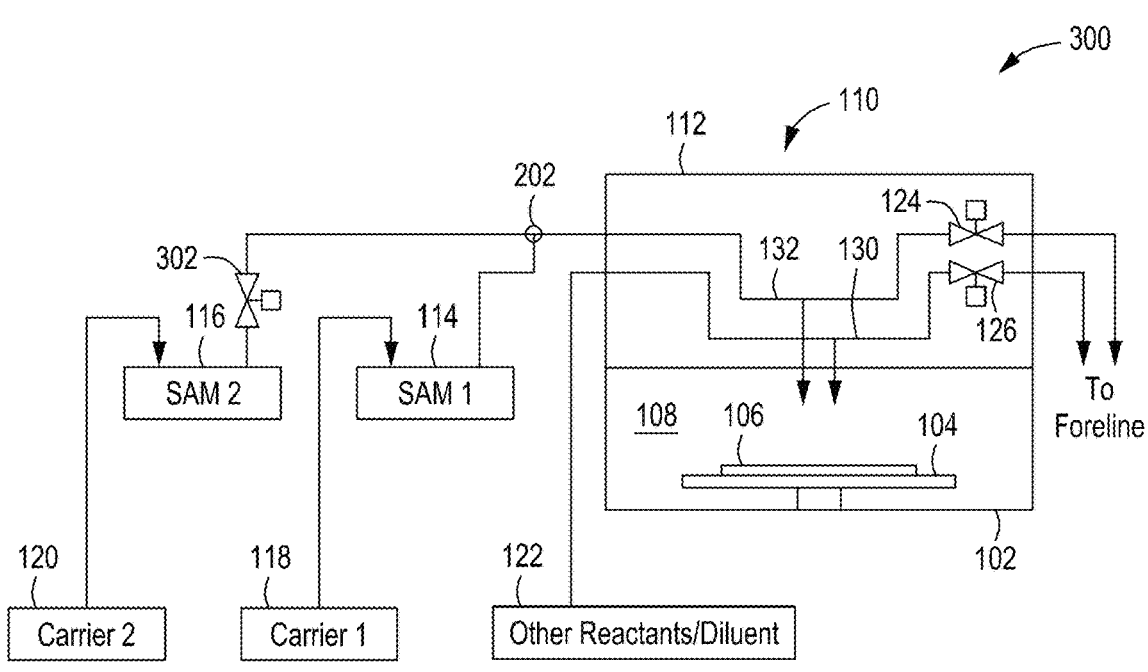
FIG. 3 is a system for depositing self-assembled monolayers in accordance with at least some embodiments of the present disclosure.

FIG. 3 is a system 300 for depositing self-assembled monolayers in accordance with at least some embodiments of the present disclosure. The system 300 is similar to the system 100 and/or the system 200 except as shown in FIG. 3 and as described herein. Elements in system 300 that are the same or substantially similar to those described above with respect to FIGS. 1 and 2 have identical reference numerals and may not be further described if not necessary for the understanding of the present disclosure.

In some embodiments, and as depicted in FIG. 3, the first SAM precursor source 114 and the second SAM precursor source 116 are both coupled to a common gas passageway of the gas distribution system configured to mix the first SAM precursor and the second SAM precursor in the common gas passageway prior to delivery into the processing volume.

For example, in some embodiments, the first SAM precursor source 114 and the second SAM precursor source 116 are both coupled to the first gas passageway 130. Alternatively, or in combination, in some embodiments, the first SAM precursor source 114 and the second SAM precursor source 116 are both coupled to a mixer 202 configured to mix the first SAM precursor and the second SAM precursor in-line prior to delivery to the processing volume 108. The mixer 202 can be provided in place of or in addition to the showerhead 112.

In some embodiments, the first SAM precursor source 114 and the second SAM precursor source 116 are both coupled to the first gas passageway 130 and the additional gas source 122 is coupled to the second gas passageway 132.

In some embodiments, and as depicted in FIG. 3, a pulsing valve 302 is coupled in line between the second SAM precursor source 116 and the gas distribution system 110. In some embodiments, the pulsing valve 302 is coupled in line between the second SAM precursor source 116 and the showerhead 112. The pulsing valve can be any suitable valve used for pulsing a process gas such as is used in atomic layer deposition or other processes where pulsing of the process gas is desired. In use, the pulsing valve can be used in combination with the flow rate of the second SAM precursor (e.g., by control of the flow rate of the second carrier gas) to control the amount of the second SAM precursor relative to the amount of the first SAM precursor provided to the processing volume 108. For example, the duration of the pulses and the duration of time between pulses can be controlled to control the amount of second SAM precursor provided to the processing volume 108.

Figure 4:
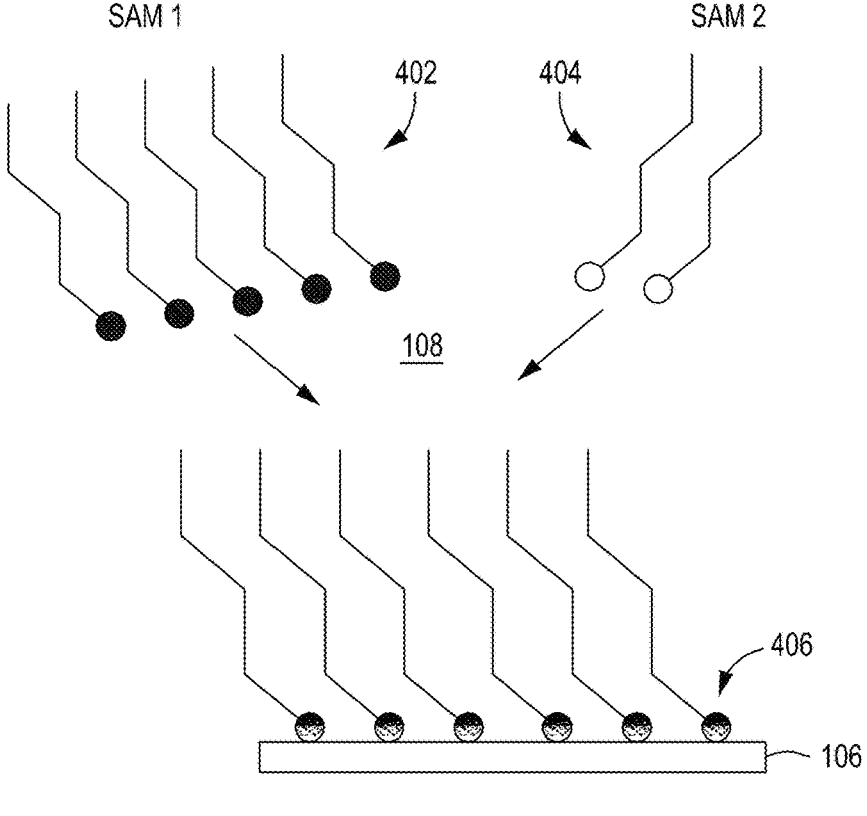
FIG. 4 is a schematic diagram of depositing self-assembled monolayers in accordance with at least some embodiments of the present disclosure.

As described above with respect to FIG. 1, the first SAM precursor source 114 and the second SAM precursor source 116 are independently controllable to control the relative percentage of the first and second SAM precursors in the process gas with respect to each other. For example, the relative percentage of the first and second SAM precursors can be controlled and provided to the mixer 202 then to the processing volume 108, to the mixer 202 then to the first gas passageway 130, or to the first gas passageway 130 without a separate mixer 202. The additional gas source 122 can be coupled to the processing volume 108, for example, FIG. 4 is a schematic diagram of depositing self-assembled monolayers in accordance with at least some embodiments of the present disclosure. As shown in FIG. 4, a first SAM precursor 402 and a second SAM precursor 404 can be provided to the processing volume 108 in controlled relative amounts using apparatus as described herein. The first SAM precursor 402 and the second SAM precursor 404 together deposit a SAM layer 406 on the substrate 106 supported in the processing volume 108. The SAM layer 406 has a controllable composition due to the independent control of the first SAM precursor 402 and the second SAM precursor 404 that can be advantageously altered during processing or over time to control on-wafer results in subsequent processing, such as for example, a selective deposition process. For example, in some embodiments, the second SAM precursor 404 can be a dopant that can be used, by control of the relative percentage of the dopant with respect to the first SAM precursor 402, to control subsequent substrate processing, such as in a selective deposition process. For example, the subsequent deposition process can be the selective TaN deposition process referred to above.

For example, in use of the disclosed apparatus, in some embodiments, a first SAM precursor and a second SAM precursor can co-flow from two SAM precursor sources, go through two different showerhead channels, and mix in the processing volume of the chamber. In some embodiments, a first SAM precursor and a second SAM precursor can co-flow from two SAM precursor sources into two gas lines, join a single gas-line later, and mix before going into the processing volume of the chamber. In some embodiments, a first SAM precursor and a second SAM precursor can co-flow from two SAM precursor sources into a mixer, and then flow into the processing volume of the chamber. In some embodiments, a first SAM precursor flows, while a second SAM precursor is pulsed into the chamber in any of the foregoing ways (e.g., through separate showerhead channels, a single gas line, mixer, or the like). In some embodiments, the first SAM precursor and the second SAM precursor can flow or pulse sequentially.

For example, in some embodiments, the first SAM precursor can be provided at a first continuous flow rate and the second SAM precursor can be independently provided at a second continuous flow rate. Alternatively, in some embodiments, the first SAM precursor can be provided at a continuous flow rate and the second SAM precursor can be independently provided at a pulsed flow rate. The duration of the pulses and the duration of time between pulses can be controlled to control the amount of second SAM precursor provided to the processing volume 108. Alternatively, in some embodiments, the first SAM precursor can be provided at a first pulsed flow rate and the second SAM precursor can be independently provided at a second pulsed flow rate. The duration of the pulses and the duration of time between pulses can be independently controlled to control the respective amounts of the first SAM precursor and/or the second SAM precursor provided to the processing volume 108.

While the foregoing is directed to embodiments of the present disclosure, other and further embodiments of the disclosure may be devised without departing from the basic scope thereof.

The invention claimed is:

1. Apparatus for self-assembled monolayer (SAM) deposition, comprising:
   a chamber enclosing a processing volume;
   a substrate support disposed in the chamber and configured to support a substrate in the processing volume;
   a gas distribution system comprising a first carrier gas source coupled to an inlet of a first SAM precursor source, an outlet of the first SAM precursor source coupled to a first inlet of an inline mixer, a second carrier gas source coupled to an inlet of a second SAM precursor source, an outlet of the second SAM precursor source coupled to a second inlet of the inline mixer, and an outlet of the inline mixer coupled to the chamber and configured to distribute a process gas comprising a mixture of the first SAM precursor, the second SAM precursor, and the carrier gas into the processing volume;
   the first SAM precursor source configured to provide a first SAM precursor as a part of the process gas; and
   the second SAM precursor source configured to provide a second SAM precursor, different than the first SAM precursor, as a part of the process gas,
   wherein the first and second SAM precursor sources are independently controllable to control a relative percentage of the first and second SAM precursors in the process gas with respect to each other.

2. The apparatus of claim 1, wherein the gas distribution system further comprises:
   a showerhead having a plurality of fluidly independent gas passageways leading to the processing volume and including at least a first gas passageway and a second gas passageway, wherein the outlet of the inline mixer is coupled to the first gas passageway, the outlet of the first SAM precursor source is coupled to the first gas passageway, and the outlet of the second SAM precursor source is coupled to the second gas passageway.

3. The apparatus of claim 2, further comprising:
   an additional gas source coupled to at least one of the first gas passageway or the second gas passageway.

4. The apparatus of claim 1, wherein the gas distribution system further comprises:
   a showerhead having a plurality of fluidly independent gas passageways leading to the processing volume and including at least a first gas passageway and a second gas passageway, wherein the first SAM precursor source and the second SAM precursor source are both coupled to the first gas passageway through the inline mixer.

5. The apparatus of claim 4, further comprising:
   an additional gas source coupled to the second gas passageway.

6. The apparatus of claim 4, further comprising:
   a pulsing valve coupled in line between the second SAM precursor source and the showerhead.

7. The apparatus of claim 1, wherein the first SAM precursor source and the second SAM precursor source are both coupled to a common gas passageway of the gas distribution system configured to mix the first SAM precursor and the second SAM precursor in the common gas passageway prior to delivery into the processing volume.

8. The apparatus of claim 1, wherein the first SAM precursor source is an ampoule or liquid delivery system containing the first SAM precursor.

9. The apparatus of claim 8, wherein the second SAM precursor source is an ampoule or liquid delivery system containing the second SAM precursor.

10. The apparatus of claim 1, further comprising a valve coupled between the first SAM precursor source and a process foreline and a valve coupled between the second SAM precursor source and the process foreline.

11. Apparatus for self-assembled monolayer (SAM) deposition, comprising:
   a chamber enclosing a processing volume;
   a substrate support disposed in the chamber and configured to support a substrate in the processing volume;
   a gas distribution system comprising a first carrier gas source coupled to an inlet of a first SAM precursor source, an outlet of the first SAM precursor source coupled to a first inlet of an inline mixer, a second carrier gas source coupled to an inlet of a second SAM precursor source, an outlet of the second SAM precursor source coupled to a second inlet of the inline mixer, and an outlet of the inline mixer coupled to the chamber and configured to distribute a process gas comprising a mixture of the first SAM precursor, the second SAM precursor, and the carrier gas into the processing volume;
   the first SAM precursor source configured to provide a first SAM precursor as a part of the process gas wherein the first SAM precursor source is an ampoule or liquid delivery system containing the first SAM precursor; and
   the second SAM precursor source configured to provide a second SAM precursor, different than the first SAM precursor, as a part of the process gas, wherein the first and second SAM precursor sources are independently controllable to control a relative percentage of the first and second SAM precursors in the process gas with respect to each other;
   wherein the gas distribution system further comprises a showerhead having a plurality of fluidly independent gas passageways leading to the processing volume and including at least a first gas passageway and a second gas passageway, wherein the outlet of the inline mixer is coupled to the first gas passageway, the outlet of the first SAM precursor source is coupled to the first gas passageway and the second SAM precursor source is coupled to one of the first gas passageway or the second gas passageway; and an additional gas source coupled to at least one of the first gas passageway or the second gas passageway.

12. The apparatus of claim 11, wherein the second SAM precursor source is an ampoule or liquid delivery system containing the second SAM precursor.

13. The apparatus of claim 11, further comprising a valve coupled to the first gas passageway downstream of the first SAM precursor source and upstream of a process foreline, and a valve coupled to the second gas passageway downstream of the second SAM precursor source and upstream of the process foreline, wherein the valves are configured to selectively divert flow from the first SAM precursor source and/or the second SAM precursor source to the process foreline.

14. The apparatus of claim 11, wherein the second SAM precursor source is coupled to the first gas passageway.

15. The apparatus of claim 14, further comprising a pulsing valve coupled in line between the second SAM precursor source and the showerhead.

16. The apparatus of claim 11, wherein the second SAM precursor source is coupled to the second gas passageway.

* * * * *